United States Patent [19]
Eisfeller et al.

[11] Patent Number: 5,384,161
[45] Date of Patent: Jan. 24, 1995

[54] SYSTEM FOR MAKING BRIGHT ALUMINUM PARTS

[75] Inventors: Richard C. Eisfeller, Greenland; John Clark, Stratham, both of N.H.

[73] Assignee: Davidson Textron Inc., Dover, N.H.

[21] Appl. No.: 176,788

[22] Filed: Jan. 3, 1994

Related U.S. Application Data

[62] Division of Ser. No. 886,496, May 22, 1992, Pat. No. 5,290,625.

[51] Int. Cl.$^6$ .............. B05D 3/02; B05D 1/02
[52] U.S. Cl. .................... 427/250; 427/295; 427/385.5; 427/405; 427/409; 427/421; 148/265; 148/688; 148/DIG. 33
[58] Field of Search ............ 427/250, 295, 385.5, 427/405, 409, 421; 148/265, 688, DIG. 33

[56] References Cited

U.S. PATENT DOCUMENTS

| | | | |
|---|---|---|---|
| 2,992,125 | 7/1961 | Fustier | 117/71 |
| 2,993,806 | 7/1961 | Fisher et al. | 117/71 |
| 3,118,781 | 8/1960 | Downing | 117/33.3 |
| 3,876,435 | 4/1975 | Dollman | 106/14 |
| 3,914,472 | 10/1975 | Nakanishi et al. | 427/250 |
| 4,101,698 | 7/1978 | Dunning et al. | 428/31 |
| 4,131,489 | 12/1978 | Newhard, Jr. | 148/6.16 |
| 4,131,530 | 12/1978 | Blum et al. | 204/192 |
| 4,146,410 | 3/1979 | Reinhold | 148/6.2 |
| 4,211,822 | 7/1980 | Kurfman et al. | 428/412 |
| 4,215,170 | 7/1980 | Olivia | 428/328 |
| 4,407,871 | 10/1983 | Eisfeller | 428/31 |
| 4,431,711 | 2/1984 | Eisteller | 428/31 |
| 4,713,143 | 12/1987 | Eisfeller | 156/655 |

*Primary Examiner*—Benjamin L. Utech
*Attorney, Agent, or Firm*—Reising, Ethington, Barnard, Perry & Milton

[57] ABSTRACT

An aluminum object is manufactured by a process including chromate conversion coating of the aluminum object; sequentially applying a primer coat to the outer surface and thereafter applying a dielectric substrate basecoat; vacuum metallizing a corrosion prone metal, namely indium, on the dielectric substrate basecoat to form "islands" of the indium that are top coated with a clear resinous layer to encapsulate and insulate the islands, one from another. The indium islands are less than one thousand angstroms thick and have an average diameter of less than three thousand angstroms. The island structure is etched following the growth of the metal as it is deposited between the nucleation stage and the stage of channelization of formation of an electrically conductive film. The etchant is selected to clear channels between island structures to improve adhesion of a dielectric resinous top coat to the dielectric substrate by order of magnitude to adhesion to the islands.

1 Claim, 1 Drawing Sheet

SYSTEM FOR MAKING BRIGHT ALUMINUM PARTS

This is a division, of application Ser. No. 07/886,496, filed on May 22, 1992, now U.S. Pat. No. 5,290,625.

TECHNICAL FIELD

This invention pertains to bright trim articles and more particularly to a method for manufacturing bright trim articles by vapor deposition of amphoteric materials on an aluminum part.

BACKGROUND ART

Vacuum metallizing of plastic and similar dielectric substrates is disclosed in various forms including U.S. Pat.:

| | |
|---|---|
| 2,992,125 | Fustier |
| 2,993,806 | Fisher |
| 3,118,781 | Downing |
| 3,914,472 | Nakanishi |
| 4,101,698 | Dunning |
| 4,131,530 | Blum |
| 4,211,822 | Kaufman |
| 4,215,170 | Oliva |

My prior U.S. Pat. No. 4,431,711 issued Feb. 14, 1984, relates to metal film island structure and spacing to the appearance and performance of a commercial product, to the conductivity of the metal layer, to the corrosion resistance of the metal layer and/or to the adhesion of the top coat. It further relates to nucleation and film growth to a desired island structure and spacing that achieves these ends.

With regard to the last statement, two excellent reference books are:
*Thin Film Phenomena*, Kasturi L. Chopra, Robert E. Kreiger Publishing Company, Huntington, N.Y., 1979. See especially pp. 163 et seq.
*Handbook of Thin Film Technology*, Leon I. Maissel and Reinhard Glang, McGraw-Hill Book Company, New York, N.Y., 1970. See especially pp. 8–32 et seq.

These texts discuss and illustrate the stages of metal film growth by vacuum deposition from metal nucleation and nuclei growth, to liquid coalescence, to electrically discrete islands, channelization with incipient film conductivity, and finally, full continuous film formation. Film formation of vacuum deposited metals on plastic substrates for commercial products, especially on elastomeric plastic substrates, is not discussed. Nor is the interdependence of the natures of the metal film and the top coating correlated with product performance.

My U.S. Pat. No. 4,431,711 shows the significant difference in performance to be obtained with a vacuum metallized flexible plastic product, top coated, where the metal particles are coalesced only to the island state instead of being allowed to coalesce to beyond the channelization stage where film conductivity is established.

In the '711 patent, the separate islands are coalesced from separate nucleation points and are globular or rounded and fused appearing and are part of the nucleation and growth process.

In general, the coalesced islands forming the indium films of the '711 patent are smaller and there is a much greater spacing between them that can be filled with the resin of the top coating, in effect encapsulating the islands and binding them to the substrate surface. The rounded islands are better protected by the resin and the film over all is far more corrosion resistant, surprisingly so. The metal film is much more securely adhered to the substrate—a very significant advantage. The appearance of the globular island product is better—it is more specular, more reflective.

The construction of the indium island structure in U.S. Pat. No. 4,431,711 includes islands that are separated by channels which receive the top coat to bond the resinous film of the top coat to the substrate for the indium island structures. While the island structures are suitable for their intended purpose, it has been observed that the channels formed between the individual islands also contain many clusters and smaller islands of residual material. It is believed that this material reduces the total effective area of substrate material to which the top coat can be bonded. Consequently, the resultant bright trim article may be subject to undesirable delamination between the top coat and the substrate material.

My U.S. Pat. No. 4,713,143 discloses a corrosion resistant vacuum metallized article of bright metallic material in which a dielectric substrate surface has a vacuum deposited layer of metal selected from a group consisting of indium and alloys thereof which alloys are predominantly of indium and wherein the vacuum deposition is continued only until there is a formation of discrete islands which visually appear as a continuous film, but that have channels formed between the discrete islands of a dimension so as to maintain the islands electrically non-conductive over the surface area of the substrate, wherein the process includes etching the vacuum deposited discrete islands with a solvent which slowly dissolves or removes residual amounts of indium from the channels between the distinct islands so as to clear the channels to expose additional bonding surfaces on the substrate for increasing the surface area of adhesion between the substrate and a protective dielectric top coat.

The deposited islands are formed by indium which is amphoteric and thus has some solubility in both acids and bases. As deposited, the indium metal layer is composed of tiny islands ranging from tiny clusters of 25 angstroms or less in diameter. The tiny clusters are barely resolvable in the transmission electronic microscope. The islands can increase in diameter to sizes as large as 4,000 angstroms in diameter. Each of the islands is separated by channels which can be several hundred angstroms wide. However, in the deposition process to form the aforedescribed indium island structure, it is observed that many clusters and small islands of residual indium material may exist in the channels which produce the desired electrically non-conductive characteristics across the surface of the substrate. The process of my '143 patent includes etching the previously deposited indium material with a solution that slowly dissolves or removes the small clusters and islands to clean the channels and thereby define an additional surface area against which the top coat can adhere to the base coat so as to improve its adhesion to the base coat. The typical adhesion strength of a top coat material to a base coat material is in the order of 2 orders of magnitude stronger than the adhesion strength of the top coat to the metal making up the individual island structures separated by the channels. The treatment steps for vacuum deposited islands just before top coating consists of rinsing the part in a 10% NaOH solution for 60 to 90 seconds in a temperature range of 150–160° F. followed by two water rinses and a second rinse with deionized water. This etch treatment step greatly improves the adhesion of top coat material of the type set forth in U.S. Pat. No. 4,431,711. While the flexible substrate described in U.S. Pat. No. 4,431,711 has sufficient adhesion to pass most automotive specification tests, it is desirable to improve the adhesion in such article so that it will consistently pass an X-scribed type taped adhesion test after either Florida exposures or accelerated weathering tests including (QUV, weatherometer, xenon, dual carbon arc weatherometer). With increasing emphasis on quality in American made cars, such tests are now beginning to show up in automotive specifications (see, for example, Fisher Body FBMS 1-51 specification). While etching the island containing metal layers of the type described in U.S. Pat. No. 4,431,711, an improved adhesion between top coat and base coat materials results so that such X-scribed standards can be met.

PRESENT INVENTION

The present invention includes an aluminum part having a surface covered by laminated coats including a conversion coating, e.g., a chromate coating that improves paint adhesion; a layer of primer material; a layer of basecoat material such as an organic dielectric plastic; a layer of a macroscopically continuous-appearing film of a vacuum deposited corrosion prone metal, specifically indium and alloys thereof consisting predominantly of indium and acting in much the same manner as pure indium. Preferably, the alloys each have a melting point in the range of 125° to 250° C. The resultant film is in the form of minute specular electrically discrete rounded metal islands with etched channels formed therebetween defining a high adhesion force bonding surface between the top coat and the article of manufacture; and a top coat layer applied over the metal film encapsulating and protecting the metal particles and binding them firmly to the substrate.

This resultant product is particularly useful in the automotive applications as an aluminum wheel, aluminum wheel cover, other automobile accessories, plumping, decorative hardware or other components to replace heavier and more expensive conventional chrome plated metal parts.

The invention will now be described by way of the following examples and with reference to the accompanying drawing, with it being understood that other advantages and a more complete understanding of the invention will be apparent to those skilled in the art from the succeeding detailed description of the invention and the accompanying drawing hereto.

BRIEF DESCRIPTION OF DRAWINGS

FIG. 1 shows one part that is constructed by practicing the method of the present invention. Specifically, an aluminum wheel 10 is illustrated having an outer surface 12 of the base aluminum material covered by a multi-layer coating 14 in accordance with the present invention.

Figure 1:
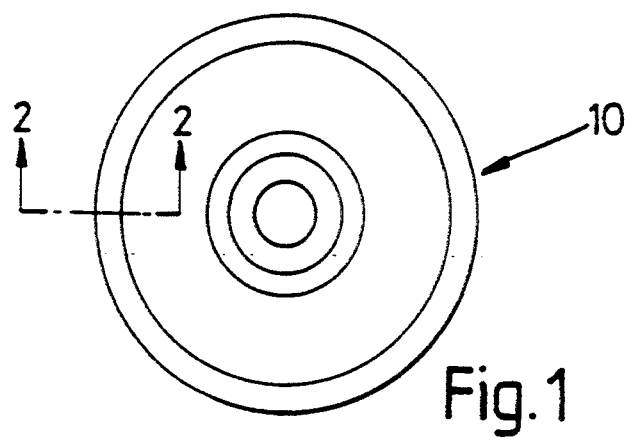
FIG. 1 is a front elevational view of a wheel including the present invention.

In the embodiment of FIG. 1, the multi-layer coating 14 is comprised of a standard conversion coating layer 16 of chemical or electrochemical treatment such as a chromate coating. One suitable chromate conversion coating is Parker Amchem Alodine 1200S.

Figure 3:
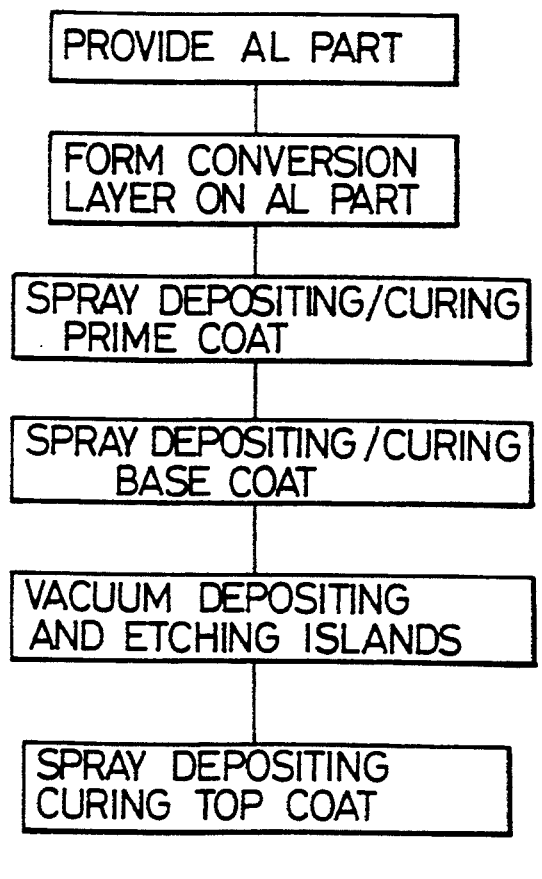
FIG. 3 is a chart showing the method of the invention.

The conversion coating layer 16 is covered by a primer coat 18 of a urethane resin as described in U.S. Pat. Nos. 4,407,871 and 4,431,711 having a thickness of from 0.1 to 2.0 mils. As shown in FIG. 3, the process of the present invention includes covering by spraying the primer coat 18 on the conversion coating layer 16 and curing the primer coat 18.

Figure 2:
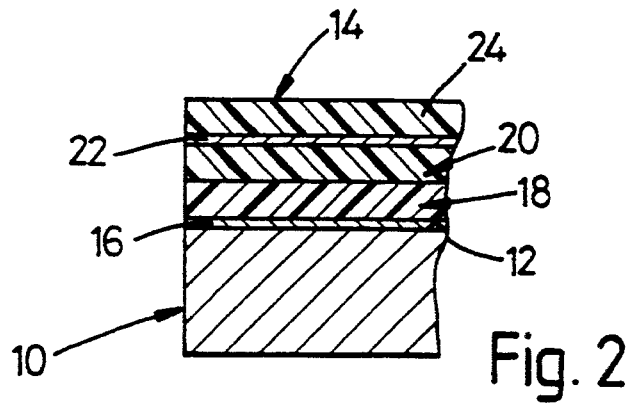
FIG. 2 is an enlarged cross-sectional view taken along the line 2—2 of FIG. 1 looking in the direction of the arrows.

The primer coat 18 is covered by a basecoat layer 20 of a suitable polymer material as described in U.S. Pat. Nos. 4,407,871 and 4,431,711, both of which are incorporated herein by reference, having a thickness of 0.1 to 2.0 mils. As shown in FIG. 3, the process of the present invention includes covering by spraying the basecoat layer 20 on the primer coat 18 and curing the basecoat layer 20. As shown in FIG. 2, the primer coat 18 and the basecoat layer 20 form a dielectric barrier over the conversion coating layer 16.

The primer coat 18 is covered by a film layer 22 of etched vacuum metallized indium metal islands having a thickness of 25 to 2,000 angstroms that are formed in accordance with the process set forth in U.S. Pat. No. 4,431,711 that is owned by the assignee of the present invention and whose process is hereby incorporated by reference. The etching of the present invention includes the steps of etching the valleys of the indium island coating of the '711 patent by the etching steps set forth in U.S. Pat. No. 4,713,143 also owned by the assignee of the present invention and whose etching steps are also hereby incorporated by reference.

Finally, the multi-layer coating 14 is covered by an outer layer of material in the form of a topcoat 24 having a thickness of 0.1 to 2.0 mils and is formed from a protective dielectric plastic material such as a layer of clear polyurethane material as described in U.S. Pat. Nos. 4,431,711 and 4,407,871.

Examples of Aluminum Coated Parts

Example No. 1

Aluminum Part—A plain aluminum plaque cut from A1-300-H14, a Parker Amchem Corporation material.

Primer—Polyurethane resin is flashed at room temperature for twenty minutes to remove solvents and then baked for twenty minutes at 260° F. to cure.

Basecoat—Polyurethane resin material is flashed at room temperature for 20 minutes and then baked for 30 minutes at 260° F.

Metallizing—Indium as applied in U.S. Pat. No. 4,431,711.

Etch—90 seconds at 160 degrees F. in a 10% sodium hydroxide bath.

Topcoat—Polyurethane resin is applied and flashed for 20 minutes to allow the solvent to evaporate and then cured by baking for 30 minutes at a temperature of 260° F.

All of the coatings were formed from a polyurethane resin material and the coatings were applied by spray coating from a Binks Model 62 spray gun.

Example #2—Oldsmobile Achieva Aluminum wheel processed in exactly the same manner.

The aforesaid examples show promising results for bright trim of aluminum parts including wheels and aluminum wheel covers. The samples pass initial appearance requirements and adhesion testing including a Gravelometer rating of 6 to 7 SAE J400 gravelometer test—a method for measuring the abrasion resistance of paints.

While a wheel 10 has been disclosed the invention is equally suitable for use in other aluminum automobile parts such as bumper inserts; wheel covers, lamp trim and wheel nuts. Additional uses for the process are for aluminum parts used in plumbing hardware applications; decorative parts for home decoration, trucks, motorcycles and marine parts.

Representative embodiments of the various bright trim aluminum parts of the present invention and there method of manufacture will be readily understood by those skilled in the art and with it being understood that other forms and shapes and method steps are included within the scope of the invention that is only limited within the scope of the appended claims.

What is claimed is:

1. A process for manufacturing an aluminum part comprising the steps of:

provising an aluminum base;

chemically combining the aluminum base with chromium to form a chromate conversion coating layer on said aluminum base formed as a compound of the aluminum base;

spray depositing and curing a primer coat on said chromate conversion coating layer, said primer coat being a polyurethane material and having a thickness of from 0.1 to 2.0 mils;

thereafter spray depositing and curing a basecoat on said primer coat to cover said primer coat and to form a dielectric barrier, said basecoat being a polyurethane material and having a thickness of from 0.1 to 2.0 mils;

vacuum depositing indium to form a film having a thickness of 25 to 2000 angstroms covering said basecoat including a plurality of discrete islands of the indium appearing macroscopically as a continuous film and having a plurality of macroscopically unobservable channels between the islands to maintain the film electrically non-conductive over said basecoat;

spray depositing and curing a layer of clear resinous protective dielectric topcoat to completely cover said vacuum deposited indium film whereby said channels are filled for bonding said indium film to said basecoat.

* * * * *